(12) United States Patent
Karande et al.

(10) Patent No.: US 9,116,827 B2
(45) Date of Patent: Aug. 25, 2015

(54) SYSTEM AND METHOD FOR OPTIMIZING LUBY TRANSFORM (LT) CODES TO FACILITATE DATA TRANSMISSION OVER COMMUNICATION NETWORK

(71) Applicant: Tata Consultancy Services Limited, Maharashtra (IN)

(72) Inventors: Shirish Subhash Karande, Maharashtra (IN); Mariswamy Girish Chandra, Karnataka (IN); Sachin P. Lodha, Maharashtra (IN)

(73) Assignee: Tata Consultancy Services Limited, Mumbai, Maharashtra (IN)

( * ) Notice: Subject to any disclaimer, the term of this patent is extended or adjusted under 35 U.S.C. 154(b) by 132 days.

(21) Appl. No.: 14/015,034

(22) Filed: Aug. 30, 2013

(65) Prior Publication Data

US 2015/0067451 A1    Mar. 5, 2015

(51) Int. Cl.
*H03M 13/00*  (2006.01)
*G06F 11/10*  (2006.01)
*H04L 1/00*   (2006.01)
*H03M 13/37*  (2006.01)

(52) U.S. Cl.
CPC ........... *G06F 11/10* (2013.01); *H03M 13/3761* (2013.01); *H04L 1/0057* (2013.01)

(58) Field of Classification Search
CPC ..... G06F 11/10; H03M 13/373; H03M 13/11; H03M 13/3761; H04L 1/0057
USPC .............. 375/295, 240.07; 715/706; 714/752, 714/776
See application file for complete search history.

(56) References Cited

U.S. PATENT DOCUMENTS

| | | | |
|---|---|---|---|
| 8,359,511 B2 | 1/2013 | Agarwal | |
| 2010/0023859 A1* | 1/2010 | Dawson et al. | 715/706 |
| 2010/0100791 A1* | 4/2010 | Abu-Surra et al. | 714/752 |
| 2010/0153181 A1* | 6/2010 | Altunbasak et al. | 705/10 |
| 2011/0241911 A1* | 10/2011 | Yang et al. | 341/52 |

(Continued)

FOREIGN PATENT DOCUMENTS

| | | |
|---|---|---|
| CN | 101826940 | 9/2009 |
| CN | 102142934 | 8/2011 |
| DE | 102010029113 A1 | 11/2011 |

OTHER PUBLICATIONS

Ehsan Namjooa, Ali Aghagolzadeha, Javad Museviniya, "Robust transmission of scalable video stream using modified LT codes", vol. 37, Issue 5, Sep. 2011, pp. 768-781.

(Continued)

*Primary Examiner* — David Ton
(74) *Attorney, Agent, or Firm* — Hayes Soloway, PC

(57) ABSTRACT

A system(s), method(s) and computer program product to optimize Luby Transform codes to facilitate a transmission of data over a communication network are disclosed. Demands from various sinks are received and a demand vector is calculated. Various sources are employed with LT codes to encode the data. A Generalized LT code (GLT) is generated for an objective function determined for a given demand vector irrespective of the LT codes employed at the sources. Morphing rules are designed by optimizing a degree distribution of the data and mapping LT codes to the generalized LT codes. The GLT is optimized by using a linear transformation to obtain optimal morphing rules. The LT codes are retargeted by re-encoding an LT encoded data to further obtain an LT re-encoded data. The LT re-encoded data is then transmitted by a relay device to plurality of sinks.

17 Claims, 5 Drawing Sheets

(56) References Cited

U.S. PATENT DOCUMENTS

2011/0274202 A1* 11/2011 Jeong et al. .................. 375/295
2013/0308700 A1* 11/2013 Koike-Akino et al. .. 375/240.07

OTHER PUBLICATIONS

Ming Xiao, "Efficient Coding Techniques for Networks & Channels with Transmission Errors", Department of Computer Science and Engineering Chalmers University of Technology, Goteborg, Sweden, 2007.

Andrew Liau, "Low-Complexity Soliton-like Network Coding for a Resource-Limited Relay" Oct. 2011, Queen's University, Kingston, Ontario, Canada.

Simon S. Woo, Michael K. Cheng, "Prioritized Luby Transform (LT) codes" Mar. 20, 2008, Jet Propulsion Laboratory, CA California Institute of Technology, CA, Princeton, NJ.

* cited by examiner

SYSTEM AND METHOD FOR OPTIMIZING LUBY TRANSFORM (LT) CODES TO FACILITATE DATA TRANSMISSION OVER COMMUNICATION NETWORK

TECHNICAL FIELD

The present disclosure in general relates to a method and system for optimizing fountain codes. More particularly, the present disclosure relates to system(s) and method(s) for optimizing LT (Luby Transform) codes.

BACKGROUND

Luby Transform codes are fountain codes that are used for encoding and decoding data in two-way communication. LT encoding lends itself to distributed implementation, and hence can be used to improve the communication efficiency by enabling parallel downloads from multiple mirror sites or disks. These days in order to achieve complete data recovery, LT codes are optimized by using various variation methodologies.

The generalization of LT codes helps in improving the data recovery. However, it is difficult to design the generalized LT codes for a large number of demand sets. Methods used for design of GLT codes require non-linear and often exhaustive search. Hence, the time-complexity for design can be high, leading to poor designs in several cases. Distributed LT codes have also been designed to address the sensitivity of LT codes towards the degree distribution. This has been achieved by selectively XOR-ing the symbols at the relay in order to create a statistical effect of construction an LT code on the concatenation of all source files. Although the methods results in reduction in download time, however it is limited to the cases where all sources have equal priority and all sinks have equal demands.

Other such methods towards design of LT codes have been proposed by A. Eryilmaz, A. Ozdaglar and M. Medard, 'On the Delay and Throughput Gains of Coding in Unreliable Network', Fragouli and E. Soljanin, 'Network Coding Fundamentals', M Luby, 'LT codes' and A. Shokrollahi, "Raptor Codes".

SUMMARY OF THE INVENTION

This summary is provided to introduce aspects related to systems and methods for optimizing LT codes to facilitate data transmission over a communication network and the aspects are further described below in the detailed description. This summary is not intended to identify essential features of the claimed subject matter nor is it intended for use in determining or limiting the scope of the claimed subject matter.

The present disclosure relates to a method for optimizing Luby Transform (LT) codes to facilitate data transmission over a communication network. The method comprises receiving demands for data from a plurality of sinks, wherein the data is collected from one or more sources, wherein the sources are employed with the LT codes to encode the data, calculating a demand vector for each sink of the plurality of sinks based upon the demands and generating a generalized LT code for an objective function determined for a given demand vector irrespective of the LT codes employed at the sources, wherein the generalized LT code is generated based upon a size of the data, and wherein the generalized LT is generated for a set of sinks of the plurality of sinks. The method further comprises of designing morphing rules by optimizing a degree distribution of the LT code and mapping the LT code employed at the source to the generalized LT code, optimizing the generalized LT (GLT) code for the objective function by using a linear transformation to obtain optimal morphing rules, wherein the linear transformation is parameterized in terms of one or morphing rules and re-targeting the LT distribution employed at the source by re-encoding an LT encoded data in accordance with the optimal morphing rules to produce an LT re-encoded data. The method further comprises of transmitting the LT re-encoded data with respect to the demands of the one or more sinks. The calculating, the generating, the designing, the optimizing and the re-targeting are performed by a processor.

The present disclosure also relates to a system for optimizing LT (Luby Transform) codes to facilitate data transmission over a communication network. The system comprises a receiver configured to receive demands for data from plurality of sinks, wherein the data is collected from one or more sources, wherein the sources are employed with the LT codes to encode the data, a processor and a memory coupled to the processor. The processor is capable of executing a plurality of modules stored in the memory. The plurality of module comprises a calculating module configured to calculate a demand vector for each sink of the plurality of sinks based upon the demands, a generating module configured to generate a generalized LT code for an objective function determined for a given demand vector irrespective of the LT codes employed at the sources, wherein the generalized LT code is generated based upon a size of the data, and wherein the generalized LT code is generated for a set of sinks of the plurality of sinks and a designing module configured to design morphing rules by optimizing a degree distribution of the LT code and mapping the LT code employed at the source to the generalized LT code. The plurality of modules further comprises an optimizing module configured to optimize the generalized LT code (GLT) by using a linear transformation to obtain optimal morphing rules, wherein the linear transformation is parameterized in terms of one or more morphing rules and a retargeting module configured to re-target the LT distribution employed at the sources by re-encoding an LT encoded data in accordance with the optimal morphing rules to produce an LT re-encoded data. The system further comprises a relay device configured to transmit the LT re-encoded data with respect to the demands of the one or more sinks.

The present disclosure also relates to a computer program product having embodied thereon a computer program for optimizing Luby Transform (LT) codes to facilitate data transmission over a communication network. The computer program product comprises a program code for receiving demands for data from a plurality of sinks, wherein the data is collected from one or more sources, wherein the sources are employed with the LT codes to encode the data, program code for calculating a demand vector for each sink of the plurality of sinks based upon the demands and a program code for generating a generalized LT code for an objective function determined for a given demand vector irrespective of the LT codes employed at the sources, wherein the generalized LT code is generated based upon a size of the data, and wherein the generalized LT is generated for a set of sinks of the plurality of sinks. The computer program product further comprises a program code for designing morphing rules by optimizing a degree distribution of the LT code and mapping the LT code employed at the source to the generalized LT code, a program code for optimizing the generalized LT (GLT) code for the objective function by using a linear transformation to obtain optimal morphing rules, wherein the linear transformation is parameterized in terms of one or morphing rules, a program code for re-targeting the LT distribution employed at the source by re-encoding an LT encoded data in accordance with the optimal morphing rules to produce an LT re-encoded data and a program code for transmitting the LT re-encoded data with respect to the demands of the one or more sinks.

BRIEF DESCRIPTION OF DRAWINGS

The detailed description is described with reference to the accompanying figures. In the figures, the left-most digit(s) of a reference number identifies the figure in which the reference number first appears. The same numbers are used throughout the drawings to refer like features and components.

DETAILED DESCRIPTION

While aspects of described system and method to optimize a Luby Transform (LT) code may be implemented in any number of different computing systems, environments, and/or configurations, the embodiments are described in the context of the following exemplary system.

Figure 1:
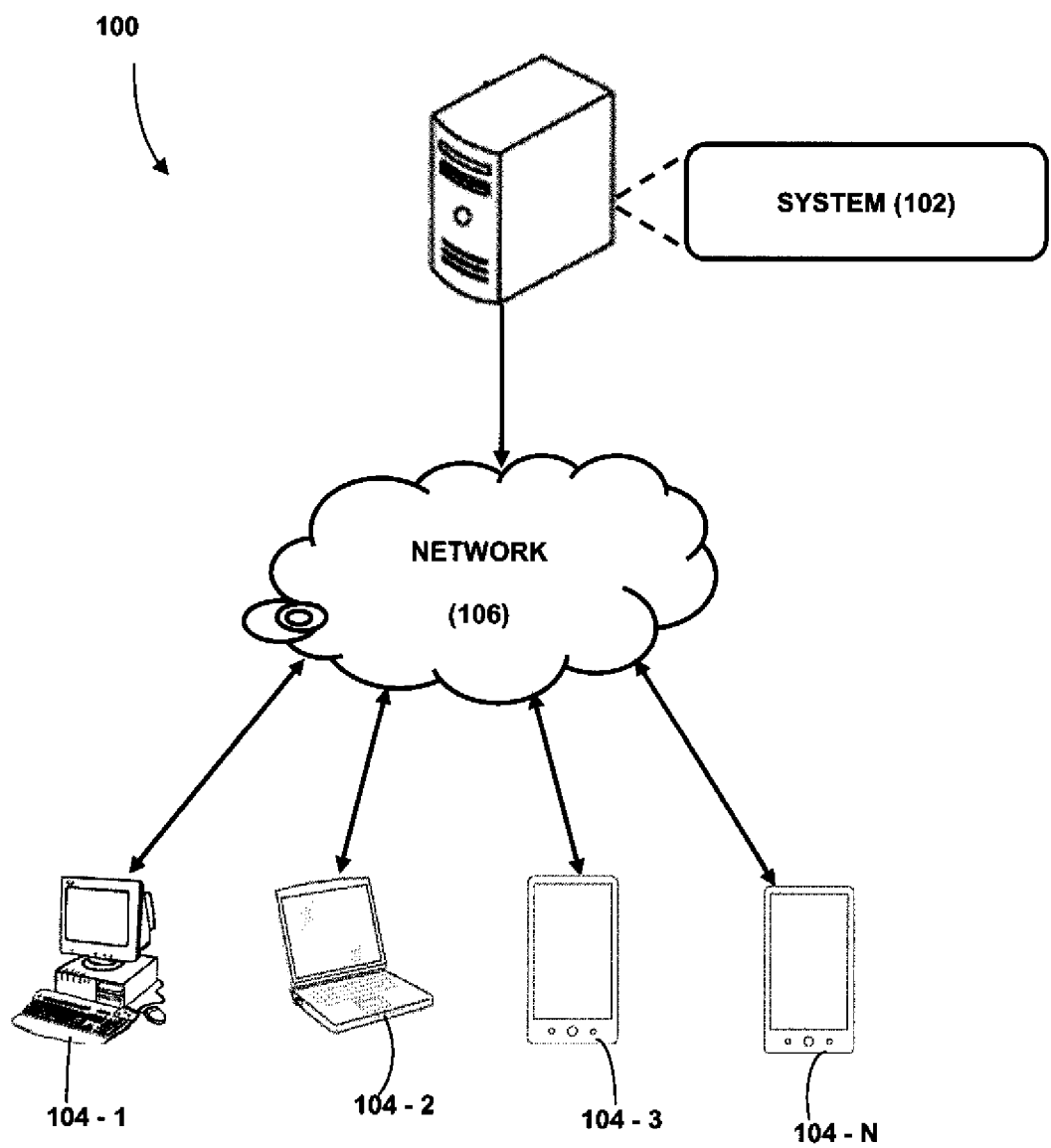
FIG. 1 illustrates a network implementation of a system to optimize Luby Transform codes to facilitate data transmission over a communication channel is shown, in accordance with an embodiment of the present subject matter.

Referring now to FIG. 1, a network implementation 100 of system 102 to optimize a Luby Transform (LT) code is illustrated, in accordance with an embodiment of the present subject matter. In one embodiment, the system 102 provides optimization of the LT code by receiving demand of data from plurality of sources. Data is collected from one or more sources to meet the demand of the plurality of sinks. A demand vector is then collected for the demand of data and size of data. By optimizing demand vector a generalized LT code (generalized LT distribution) is generated. By optimizing degree distribution of data and mapping a probability of forwarding an XOR of symbols with the generalized LT code, mixing rules are generated. Data is then encoded based upon the mixing rules and is transmitted.

Although the present subject matter is explained considering that the system 102 is implemented as an application on a server, it may be understood that the system 102 may also be implemented in a variety of computing systems, such as a laptop computer, a desktop computer, a notebook, a workstation, a mainframe computer, a server, a network server, and the like. It will be understood that the system 102 may be accessed by multiple users through one or more user devices 104-1, 104-2 . . . 104-N, collectively referred to as user 104 hereinafter, or applications residing on the user devices 104. Examples of the user devices 104 may include, but are not limited to, a portable computer, a personal digital assistant, a handheld device, and a workstation. The user devices 104 are communicatively coupled to the system 102 through a network 106.

In one implementation, the network 106 may be a wireless network, a wired network or a combination thereof. The network 106 can be implemented as one of the different types of networks, such as intranet, local area network (LAN), wide area network (WAN), the Internet, and the like. The network 106 may either be a dedicated network or a shared network. The shared network represents an association of the different types of networks that use a variety of protocols, for example, Hypertext Transfer Protocol (HTTP), Transmission Control Protocol/Internet Protocol (TCP/IP), Wireless Application Protocol (WAP), and the like, to communicate with one another. Further the network 106 may include a variety of network devices, including routers, bridges, servers, computing devices, storage devices, and the like.

Figure 2:
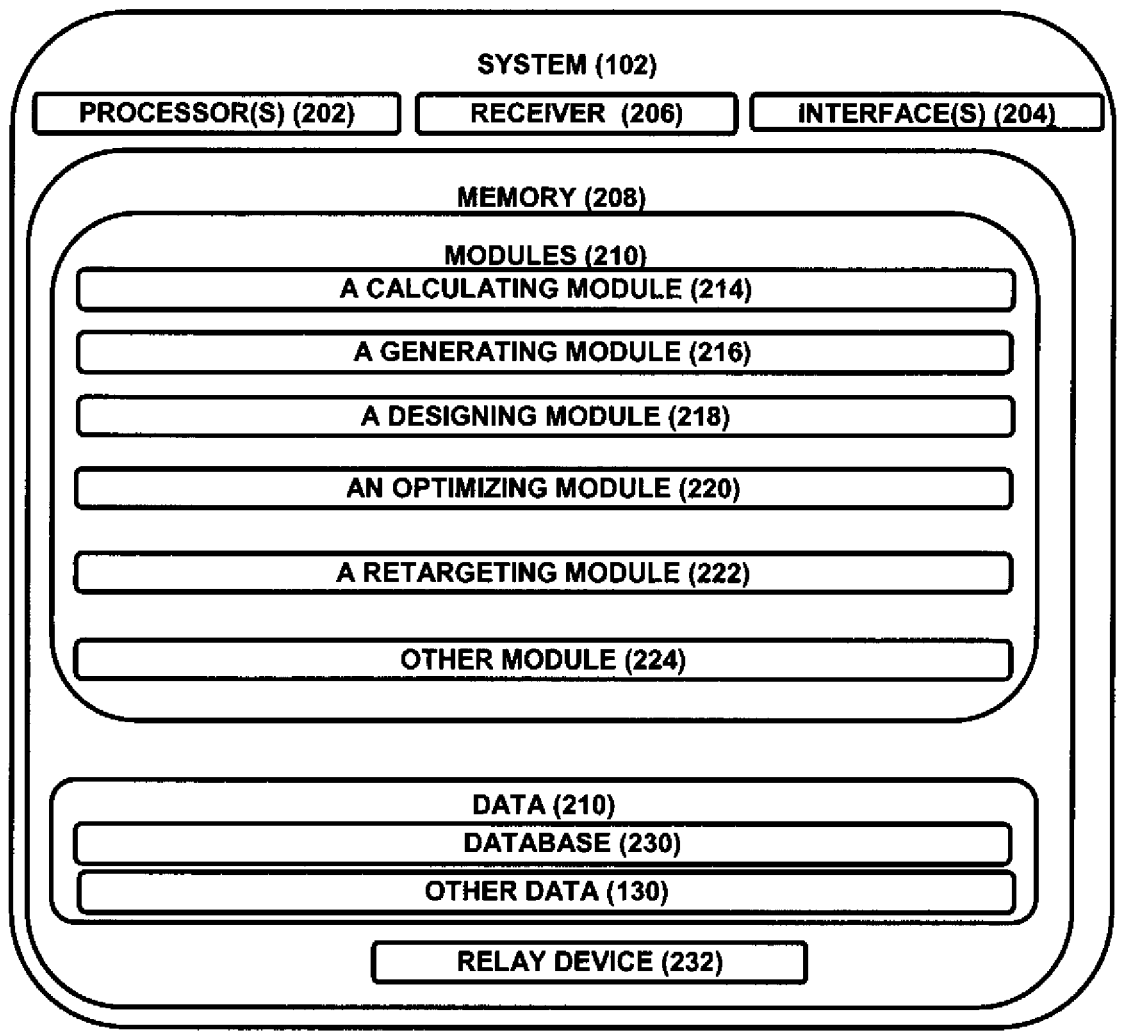
FIG. 2 illustrates the system for optimizing Luby Transform codes to facilitate data transmission over a communication network, in accordance with an embodiment of the present subject matter.

Referring now to FIG. 2, the system 102 is illustrated in accordance with an embodiment of the present subject matter. In one embodiment, the system 102 may include at least one processor 202, an input/output (I/O) interface 204, a receiver 206 and a memory 208. The at least one processor 202 may be implemented as one or more microprocessors, microcomputers, microcontrollers, digital signal processors, central processing units, state machines, logic circuitries, and/or any devices that manipulate signals based on operational instructions. Among other capabilities, the at least one processor 202 is configured to fetch and execute computer-readable instructions stored in the memory 208.

The I/O interface 204 may include a variety of software and hardware interfaces, for example, a web interface, a graphical user interface, and the like. The I/O interface 204 may allow the system 102 to interact with a user directly or through the client devices 104. Further, the I/O interface 204 may enable the system 102 to communicate with other computing devices, such as web servers and external data servers (not shown). The I/O interface 204 can facilitate multiple communications within a wide variety of networks and protocol types, including wired networks, for example, LAN, cable, etc., and wireless networks, such as WLAN, cellular, or satellite. The I/O interface 204 may include one or more ports for connecting a number of devices to one another or to another server.

The memory 208 may include any transitory or non-transitory computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. The memory 208 may include modules 210 and data 212.

The modules 210 include routines, programs, objects, components, data structures, etc., which perform particular tasks or implement particular abstract data types. In one implementation, the modules 210 may include a calculating module 214, a generating module 216, a designing module 218, an optimizing module 220 and a retargeting module 222. The other modules 224 may include programs or coded instructions that supplement applications and functions of the system 102.

The data 210, amongst other things, serves as a repository for storing data processed, received, and generated by one or more of the modules 210. The data 210 may also include a database 230, and other data 130. The other data 130 may include data generated as a result of the execution of one or more modules in the other module 228.

The system 102 further comprises of a relay device 226 to forward the data that is being encoded (or re-encoded) based on morphing rules (mixing rules) generated after optimization of the LT codes. Data based on morphing rules is then transmitted to plurality of sinks.

The present disclosure relates to a system(s) and method(s) for optimizing Luby Transform (LT) codes. The optimization of LT codes is performed to design LT codes in order to achieve re-targeting of the LT codes. The LT codes are designed by designing generalized LT degree distribution (Generalized LT codes) for prioritized and fractional recovery of data at plurality of sinks from one or more sources. Re-targeting of LT distributions is performed by selectively conducting an interflow coding. The interflow coding is done by generating mixing rules for the one or more sources. Based on these mixing rules, the data is re-encoded and is transmitted.

Figure 3:
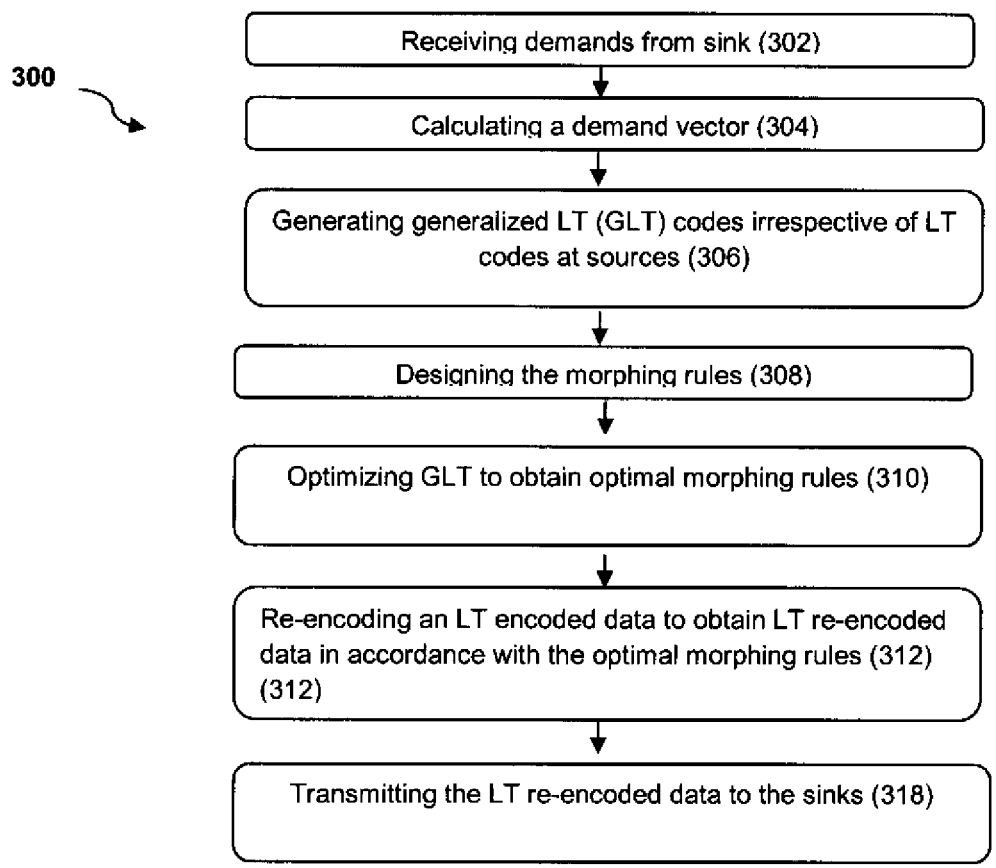
FIG. 3 illustrates a method for optimizing LT codes to facilitate data transmission over a communication network, accordance with an embodiment of the present subject matter.

In accordance with an embodiment of the invention, referring to FIG. 3, the system 102 comprises of a receiver 206 to receive demands for data from plurality of sinks. The sources are employed with the LT codes to encode data of the sources. The system 102 further comprises of a processor 202 having a memory 208. The memory 208 store plurality of modules 210 executed by the processor 204 to optimize generalized LT codes for data transmission irrespective of the LT codes employed at the sources.

The generating module 214 generates a generalized LT code (GLT) irrespective of the LT codes employed at the sources. The LT code employed at the sources act as a constraint.

The generalized LT codes are then optimized to provide a prioritized and non-uniform data recovery at a sink's side. By way of a non-limiting example, prioritized data recovery applies to a scenario where the data 210 is video compressed using multi-resolution coding, where different parts of the data may have differing impact on the quality of video. Non-uniform recovery applies primarily to video compressed using multi-description coding. In multi description coding, the amount of data 210 determines the quality even as all segments of data 210 are individually of equal priority. The optimization helps in designing LT codes that are optimized for a given distribution of quality demands. The LT code at sources is taken as a constraint while re-targeting the LT codes.

The system 102 comprises of a receiver 206 configured to receive data demand from plurality of sinks. The receiver 206 collects a quality required by each sink and estimates the channel conditions and bandwidth constraint for each sink. The receiver 206 further collects the rate-distortion characteristics for each source (video file). The receiver 206 is communicatively coupled to a processor 204. The calculating module 214 of the processor 204 calculates a demand vector $z=[z_{T1}, \ldots, z_{Tm}]$ for each sink, T, such that one can say that the sink desires to recover a fraction $z_{Tj}$ from segment-j (or source/disk j).

As an assumption, the entire storage content 130 to be made up of k input symbols, partitioned into m segments/sources, such that, $\forall i \in [1,m]$ segment-i contains $k_i = \alpha_i k$ symbols.

The processor 204 further comprises of a retargeting module 222 configured to perform re-encoding of symbols of data collected from sources to meet the demand of the sinks. The re-targeting module 222 may be used to XOR symbols from a data (file) prior to write the chunks to a disks or a storage device 130.

The retargeting module 222 (LT re-encoding module) may be used to form XORs of symbols being read from a disk, and helps in multicasting of data and may prove especially be useful in scenario where the data 210 has only been replicated in the storage (e.g. mirrors).

The processor 204 further comprises of generating module 216 (or generator) to generate a generalized LT code (generalized LT distribution). An input to the generating module 216 is the demand vectors for a set of sinks of the plurality of sinks, a size of various files (data) that are being demanded by the sink. The output of the generating module 216 is the Generalized LT code that has been generated for a suitable objective function.

A non-limiting Example of the objective functions include, smallest ratio of the total message symbols demanded to the total symbols downloaded by a sink. i.e.

$$\min_{T \in Sinks} \left\{ \sum_{j=1}^{m} (z_{Tj}\alpha_j)/\gamma_T \right\}$$

where the total symbols downloaded by a sink T is $\gamma_T k$.

The processor 204 further executes the designing module 216 configured to map the probability to the generalized LT distributor. The morphing rules are identified by optimizing the output distribution for the suitable objective function. While designing the morphing rules, a degree distribution of the LT code is optimized to mix the sources.

The morphing rules are generated based upon the optimized degree distribution and the mapping of the probability with the generalized LT code.

In order to obtain the generalized LT code 216 (generalized LT distribution). The processor further comprises of an optimizing module 218 to optimize the Generalized LT codes (GLT) by using a linear transformation to obtain optimal morphing rules. The linear transformation is parameterized in terms of one or more morphing rules.

The processor 204 performs plurality of functions by executing plurality of modules like the calculating module 214, the generating module 216, the designing module 218 (or morphing module), the optimizing module 220, and the retargeting module 222. The processor 204 by executing the retargeting module 222 may function as a retargeting processor and consists of multiple buffers. Each buffer is mapped to a single source and fed by LT encoded symbols from individual sources. Data packet at the top of the buffer i is fed to another module called the morphing module $1/\lambda_i$ times, where $\lambda_i$ is the arrival rate of symbols from source i, after which the packet is dropped from the buffer. Thus at each time epoch the input to a morphing module is the m LT encoded symbols from m buffers. The output is an encoded LT data. The re-encoding is governed by mixing rules (optimal morphing rules).

Optimal Mophing Rules (Mixing Rules) $\Lambda$:

Given degrees of the input symbols $\bar{d}=[d_1, L, d_m]$, of encoding symbols from all in buffers, a subset of buffers $S \subseteq [1,L,m]$ $\Lambda \frac{s}{d}$ = probability of forwarding $XOR$ of symbols the subset $S$ of buffers The optimizing module 220 also works makes the processor 204 work as a morphing rule generator and enables the generation of optimal morphing rules by optimizing generalized LT code.

By using the optimal morphing rules (missing rules), the retargeting module 222 re-encodes an LT encoded data to obtain an LT re-encoded data.

The relay device 232 then transmits the LT re-encoded data to the plurality of sinks with respect to the demands of the sinks.

Figure 4:
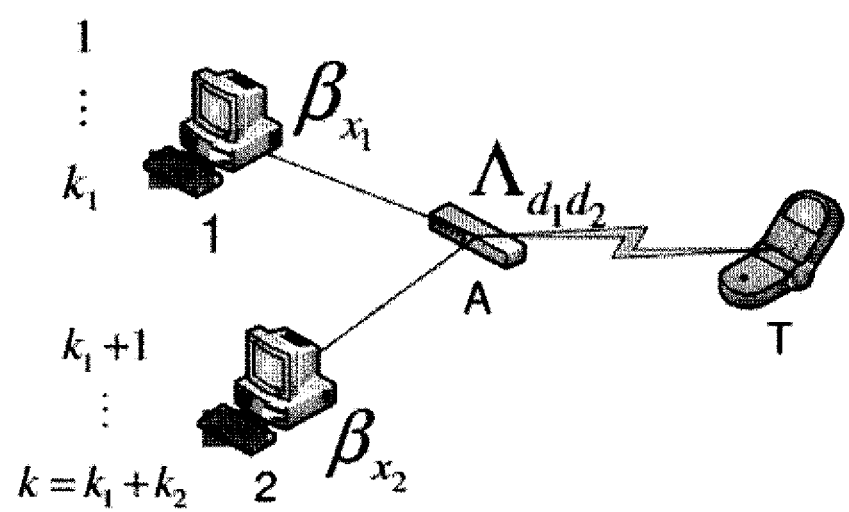
FIG. 4 illustrates a system for optimizing LT codes in accordance with an exemplary embodiment of the system.

By way of non limiting example, referring to FIG. 4, it is supposed that there is a need to transmit a message comprising of k input symbols, partitioned into m segments/sources, such that, $\forall i \in [1,m]$ segment-i contains $k_i = \alpha_i k$ symbols, than the Generalized LT code (generated by the processor by executing the generating module) is defined by a generalized degree polynomial $$\beta(x_1, \ldots, x_m) = \sum_{(d_1,\ldots,d_m)} \beta_{(d_1,\ldots,d_m)} x_1^{d_1} \ldots x_m^{d_m} \qquad i.$$

where $\beta_{(d_1, \ldots, d_m)}$ represents the probability of choosing a vector degree $\bar{d} = [d_1, \ldots, d_m]$. The encoding symbol is generated by XOR-ing $d_i$ randomly chosen input symbols from segment-i.

At the sink, prior to decoding, a sink receiver downloads sufficient number of encoding symbols, denoted here by $\gamma k$, to permit the recovery of $z_i k_i$ input symbols from each segment-i. The collection of all encoding symbols with a single undecoded neighbor are said to form a ripple. Since each symbol in the ripple is connected to a single input symbol, the ripple can be partitioned into multiple colored sub-ripples by associating a color i with each data segment-i. Similar to traditional LT decoding, in each step, the decoder utilizes an encoding symbol from any of the colored ripples to decode an input symbol, thus making other input symbols decodable. The decoding stops either when the desired fractions are recovered or when all the colored ripples become empty. The GLT codes (or LT codes) are thus designed using the following fluid approximations.

$$r_j(t_1, \ldots, t_m) = (1 - t_j)\left(\frac{\gamma}{\alpha_j}\frac{\partial}{\partial t_j}\beta(t_1, \ldots, t_m) + \log(1 - t_j)\right)$$

In the above equations, $k_i r_i(\bullet)$ gives size of the $i^{th}$ ripple when $k_i t_i$ input symbols have been decoded from the $i^{th}$ source.

The symbols from a particular segment (source) may be decoded if the corresponding ripple is non-empty. For example, a decoder at the sink may transit from state $(t_1, t_2)$ to $(t_1 + (1/k_1), t_2)$ if ripple-1 is not empty. Therefore, it is possible to recover a demand $(z_{1,i}, z_{2,i})$ if and only if there exist a sequence of feasible transitions from $(0,0)$ to $(z_{1,i}, z_{2,i})$. Analysis of all the possible paths may increase the complexity of the design. Thus, seeking degree distributions may make the straight segment from $(0,0)$ to $(z_{1,i}, z_{2,i})$ a feasible path. This allows posing the design of GLT codes in terms of the following Linear Program.

$$(\beta^*, \Delta^*) = \arg\max_{\beta, \Delta}(\Delta)$$

subject to $\forall \tau \in [0, z^*)$, and every sink T $$\frac{\partial}{\partial t_j}\beta\left(\tau, \ldots, \frac{z_{Tj}}{z^*}\tau, \ldots, \frac{z_{Tm}}{z^*}\tau\right) + \qquad i.$$

$$\frac{\alpha_1 \Delta}{\left[\sum_j \alpha_j z_{Tj}\right]}\left(\log(1-\tau) - c\sqrt{\frac{\tau}{k_j(1-\tau)}}\right) \geq 0$$

with $$\sum \beta_{([d_1, L, d_m])} = 1,$$

$$\beta_{(d_1, L, d_m)} \in [0, 1]$$

and $$\Delta \geq 0.$$

Here, $z^* = \max_{T,j}\{z_{Tj}\}$.

This is further to be assumed that the sources employ the following LT distributions:

$$\beta_1(x_1) = \sum_{d=1}^{k_1} \beta_{1,(d)} x_1^d,$$

$$\beta_2(x_2) = \sum_{d=1}^{k_2} \beta_{2,(d)} x_2^d.$$

At each epoch the relay device or the re-write device receives a symbol from the individual sources. The relay probabilistically chooses to either forward/write one of the received symbols or to transmit an XOR-ed combination of the received symbols communicating with the processor.

Upon transmission the relay device 232 discards the received symbols. The probabilistic decisions taken by the relay device may be described by "mixing rules" $\Lambda = \{\Lambda_{(d_1,d_2)}^{(1)}, \Lambda_{(d_1,d_2)}^{(2)}, \Lambda_{(d_1,d_2)}^{(1,2)}\}$, generated by the processor, where each rule represents a conditional probability distribution:

Mixing Rule (Optimal Morphing Rules)

$\Lambda$: Given degrees $d_1$, $d_2$ of encoding symbols transmitted by source 1 and 2 resp., $\Lambda_{(d_1,d_2)}^{(1)}$=probability of forwarding symbol from source 1

$\Lambda_{(d_1,d_2)}^{(2)}$=probability of forwarding symbol from source 2

$\Lambda_{(d_1,d_2)}^{(1,2)}$=probability of transmitting an X-OR where $1 \geq \Lambda_{(d_1,d_2)}^{(1)}, \Lambda_{(d_1,d_2)}^{(1,2)}, \Lambda_{(d_1,d_2)}^{(2)} \geq 0$ and $\Lambda_{(d_1,d_2)}^{(1)} + \Lambda_{(d_1,d_2)}^{(1,2)} + \Lambda_{(d_1,d_2)}^{(2)} = 1$ In order to design the mixing rules it is observed that if the sources employ degree distributions $\beta_1(x_1)$, $\beta_2(x_2)$ and the relay device employs the rules $\Lambda$ then the output of the relay device (rule-wise LT encoded data) is described by the following GLT distribution:

$$\lambda(x_1, x_2) = \sum_{(d_1,d_2)} \begin{pmatrix} \Lambda_{(d_1,d_2)}^{(1)} \beta_{1,(d_1)} \beta_{2,(d_2)} x_1^{d_1} + \\ \Lambda_{(d_1,d_2)}^{(2)} \beta_{1,(d_1)} \beta_{2,(d_2)} x_2^{d_2} \\ \Lambda_{(d_1,d_2)}^{(1,2)} \beta_{1,(d_1)} \beta_{2,(d_2)} x_1^{d_1} x_2^{d_2} \end{pmatrix}$$

Figure 5:
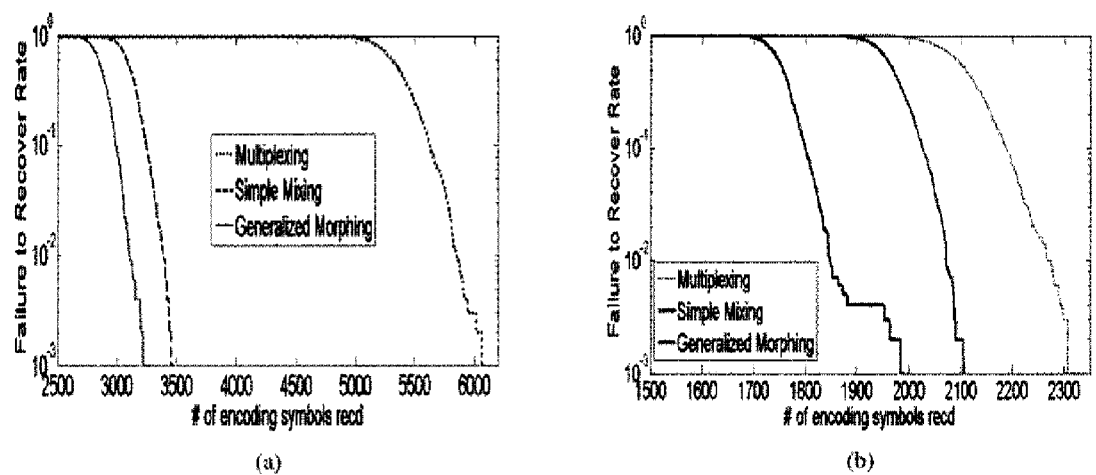
FIG. 5 illustrates the results of optimization of LT codes in accordance with an exemplary embodiment of the system.

The LP for designing the mixing rules is obtained as follows:

$$(\Lambda^*, \Delta^*) = \underset{\beta, \Delta}{\operatorname{argmax}}\, (\Delta)$$

subject to $$\forall \tau \in [0, z^*],$$

and every sink T i. $\frac{\partial}{\partial tj}\lambda\left(\tau, \ldots, \frac{z_{T_j}}{z^*}\tau, \ldots, \frac{z_{Tm}}{z^*}\tau\right) + $ $$\frac{\alpha_1 \Delta}{\left(\sum_j \alpha_j z_{T_j}\right)}\left(\log(1-\tau) - c\sqrt{\frac{\tau}{k_j(1-\tau)}}\right) \geq 0$$

with $\forall (d_1, L, d_m): \Sigma \Lambda_{(d_1,L,d_m)}^{(\cdot)}=1$, $\Lambda_{(d_1,L,d_m)}^{(\cdot)} \in [0,1]$ and $\Delta \geq 0$. Here, $z^* = \max_{r,j}\{Z_{T_j}\}$ By way of a non-limiting example, considering a network with $k^1 = 750$ and $k_2 = 1250$, where the source 1 employs an LT code for a local non-uniform demand of [0.6, 0.8], while source 2 employs the LT code for an local demand of [0.3, 0.7]. Thus, the distributions employed at the sources are given by:

$\beta_1(x_1) = 0.1 x_1^1 + 0.89 x_1^2 + 0.01 x_1^3$, $\beta_2(x_2) = 0.57 x_2^1 + 0.43 x_2^2$ This is further considered that the relay device is subscribed to two set of sinks with demands $\overline{z_1} = (0.95, 0.95)$ and $\overline{z_2} = (0.8, 0.6)$ The optimal mixing rules for the network generated by processor 204 are:

$\Lambda_{(1,1)}^{(1)} = 1$, $\Lambda_{(2,1)}^{(1)} = 0.0215$ $\Lambda_{(1,2)}^{(1,2)} = 1$, $\Lambda_{(2,1)}^{(1,2)} = 0.9785$, $\Lambda_{(2,2)}^{(1,2)} = 0.0265$, $\Lambda_{(3,1)}^{(1,2)} = 0.8532$ $\Lambda_{(3,1)}^{(2)} = 0.1468$, $\Lambda_{(2,2)}^{(2)} = 0.9735$, $\Lambda_{(3,2)}^{(2)} = 1$ If the operation of the relay device 232 is restricted to simple mixing than the optimal parameters were $p_1 = 0.12$, $p_2 = 0.47$ and $p_3 = 0.41$. A parameter, "failure to recover rate" has been defined as the probability with which a sink fails to recover its desired demand. It may be observed that mixing at the relay device by means of the processor provides significant gains (as shown in FIG. 5).

The order in which the method 300 is described is not intended to be construed as a limitation, and any number of the described method blocks can be combined in any order to implement the method 300 or alternate methods. Additionally, individual blocks may be deleted from the method 300 without departing from the spirit and scope of the subject matter described herein. Furthermore, the method can be implemented in any suitable hardware, software, firmware, or combination thereof. However, for ease of explanation, in the embodiments described below, the method 300 may be considered to be implemented in the above described system 102.

At block 302, demands from sinks are received, sources employed with LT code to encode the data.

At block 304, demand vector for the demands from sinks are calculated.

At block 306, a generalized LT code is generated for an objective function determined for a given demand vector. The generalized LT code is generated for a set of sinks of the plurality of sinks.

At block 308, morphing rules are designed.

At block 310, the GLT is optimized to obtain optimal morphing rules.

At block 312, an LT encoded data is re-encoded in accordance with the optimal morphing rules to obtain an LT re-encoded data.

At block 314, the LT re-encoded data is transmitted with respect to the demands of the one or more sinks.

The written description describes the subject matter herein to enable any person skilled in the art to make and use the embodiments of the invention. The scope of the subject matter embodiments is defined by the claims and may include other modifications that occur to those skilled in the art. Such other modifications are intended to be within the scope of the claims if they have similar elements that do not differ from the literal language of the claims or if they include equivalent elements with insubstantial differences from the literal language of the claims.

We claim:

1. A method for optimizing Luby Transform (LT) codes to facilitate data transmission over a communication network, the method comprising:
   receiving demands for data from a plurality of sinks, wherein the data is collected from one or more sources, and wherein the sources are employed with the LT codes to encode the data;
   calculating a demand vector for each sink of the plurality of sinks based upon the demands;
   generating a generalized LT code for an objective function determined for a given demand vector irrespective of the LT codes employed at the sources, wherein the generalized LT code is generated based upon a size of the data, and wherein the generalized LT code is generated for a set of sinks of the plurality of sinks;
   designing morphing rules by optimizing a degree distribution of the LT code and mapping the LT code employed at the source to the generalized LT code;
   optimizing the generalized LT (GLT) code for the objective function by using a linear transformation to obtain optimal morphing rules, wherein the linear transformation is parameterized in terms of one or morphing rules;
   re-targeting the LT code employed at the source by re-encoding a LT encoded data in accordance with the optimal morphing rules to produce a LT re-encoded data; and
   transmitting the LT re-encoded data with respect to the demands of the one or more sinks;
   wherein the receiving, the calculating, the generating, the designing, the optimizing, and the re-targeting, and the transmitting are performed by a processor.

2. The method of claim 1, wherein the data demands are unequal and non uniform data demands.

3. The method of claim 1, wherein the objective function further comprises of a smallest ratio of a total message symbol demanded to a total symbol downloaded by the sink.

4. The method of claim 1, wherein the generalized LT codes are generated by using a linear program formulation on fluid approximations.

5. The method of claim 1, wherein the generalized LT codes are generated by checking feasibility of a ripple size along a fixed state path of a decoding module present at the sink.

6. The method of claim 1, wherein the retargeting is further achieved by considering a description of an effective degree distribution at output of a relay device as a linear transformation of an input degree distribution.

7. The method of claim 1, wherein each morphing rule represents a conditional probability distribution.

8. The method of claim 1, wherein the morphing rules are used by a relay device to take a probabilistic decision with respect to the data demand of the sink.

9. A system for optimizing Luby Transform (LT) codes to facilitate data transmission over a communication network, the system comprising:
   a receiver configured to receive demands for data from plurality of sinks, wherein the data is collected from one or more sources, and wherein the sources are employed with the LT codes to encode the data;
   a processor; and
   a memory coupled to the processor, wherein the processor is capable of executing a plurality of modules stored in the memory, and wherein the plurality of module comprising:
   a calculating module configured to calculate a demand vector for each sink of the plurality of sinks based upon the demands;
   a generating module configured to generate a generalized LT code for an objective function determined for a given demand vector irrespective of the LT codes employed at the sources, wherein the generalized LT code is generated based upon a size of the data, and wherein the generalized LT code is generated for a set of sinks of the plurality of sinks;
   a designing module configured to design morphing rules by optimizing a degree distribution of the LT code and mapping the LT code employed at the source to the generalized LT code;
   an optimizing module configured to optimize the generalized LT code (GLT) by using a linear transformation to obtain optimal morphing rules, wherein the linear transformation is parameterized in terms of one or more morphing rules;
   a retargeting module configured to re-target the LT distribution employed at the sources by re-encoding an LT encoded data in accordance with the optimal morphing rules to produce an LT re-encoded data; and
   a relay device configured to transmit the LT re-encoded data with respect to the demands of the one or more sinks.

10. The system of claim 9, wherein the data demands are unequal and non uniform data demands.

11. The system of claim 9, wherein the objective function further comprises of a smallest ratio of a total message symbol demanded to a total symbol downloaded by the sink.

12. The system of claim 9, wherein the generating module uses a linear program formulation on fluid approximations to generate the generalized LT codes.

13. The system of claim 9, wherein generating module generates the generalized LT codes by checking feasibility of a ripple size along a state path of a decoding device present at the sink.

14. The system of claim 9, wherein the retargeting module is further configured to consider a description of an effective degree distribution at output of the relay device as a linear transformation of an input degree distribution in order to achieve the retargeting of the LT codes.

15. The system of claim 9, wherein each morphing (mixing) rule represents a conditional probability distribution.

16. The system of claim 9, wherein the relay device uses the morphing rules in order to take a probabilistic decision for transmitting the data with respect to the data demand of the sink.

17. A non-transitory computer readable medium embodying a program executable in a computing device for optimizing Luby Transform (LT) codes to facilitate data transmission over a communication network, the program product comprising:
   a program code for receiving demands for data from a plurality of sinks, wherein the data is collected from one or more sources, wherein the sources are employed with the LT codes to encode the data;
   a program code for calculating a demand vector for each sink of the plurality of sinks based upon the demands;
   a program code for generating a generalized LT code for an objective function determined for a given demand vector irrespective of the LT codes employed at the sources, wherein the generalized LT code is generated based upon a size of the data, and wherein the generalized LT is generated for a set of sinks of the plurality of sinks;
   a program code for designing morphing rules by optimizing a degree distribution of the LT code and mapping the LT code employed at the source to the generalized LT code;
   a program code for optimizing the generalized LT (GLT) code for the objective function by using a linear transformation to obtain optimal morphing rules, wherein the linear transformation is parameterized in terms of one or morphing rules;
   a program code for re-targeting the LT distribution employed at the source by re-encoding an LT encoded data in accordance with the optimal morphing rules to produce an LT re-encoded data; and
   a program code for transmitting the LT re-encoded data with respect to the demands of the one or more sinks.

* * * * *